United States Patent
Reiffin

[11] Patent Number: 4,864,249
[45] Date of Patent: Sep. 5, 1989

[54] NONSLEWING AMPLIFIER

[76] Inventor: Martin G. Reiffin, 5439 Blackhawk Dr., Danville, Calif. 94526

[21] Appl. No.: 290,371

[22] Filed: Dec. 29, 1988

Related U.S. Application Data

[63] Continuation-in-part of Ser. No. 162,112, Feb. 29, 1988, Pat. No. 4,823,094.

[51] Int. Cl.$^4$ ............................................. H03F 3/26
[52] U.S. Cl. .................................. 330/263; 330/268; 330/310
[58] Field of Search ............... 330/263, 264, 265, 267, 330/268, 294, 310

[56] References Cited

U.S. PATENT DOCUMENTS

| | | | |
|---|---|---|---|
| 3,537,023 | 10/1970 | Myer | 330/268 X |
| 4,622,482 | 11/1986 | Ganger | 330/264 X |
| 4,728,903 | 3/1988 | Reiffin | 330/264 |
| 4,814,723 | 3/1989 | Botti | 330/263 |

Primary Examiner—Steven Mottola

[57] ABSTRACT

A nonslewing amplifier comprises two push-pull voltage-amplification stages each having a complementary pair of grounded-emitter transistors. The first stage has a load impedance connected to each of the transistor collectors. A pair of feedback compensation capacitors are each connected from the collector output to the base input of a respective transistor of the second stage. When a large fast signal causes slewing in one half of these stages due to insufficient current from the respective load impedance to charge the associated compensation capacitor at the rate required by the signal, the transistor in the other half of the first stage draws enough current to discharge the other compensation capacitor at a rate fast enough to transmit an undistorted signal to the second stage where it is amplified and transmitted to the following drive stage. Slew limiting and transient intermodulation distortion are thereby avoided.

20 Claims, 3 Drawing Sheets

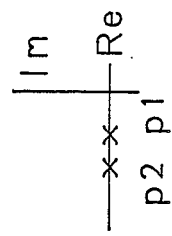
FIG. 4
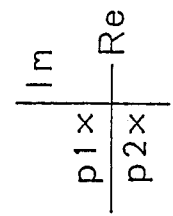
FIG. 5
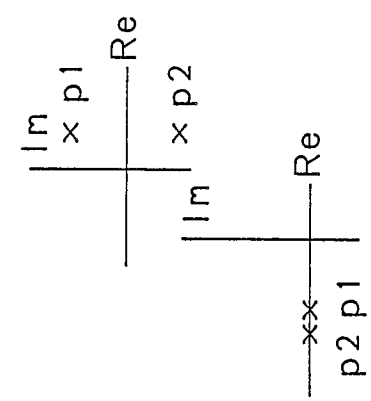
FIG. 6
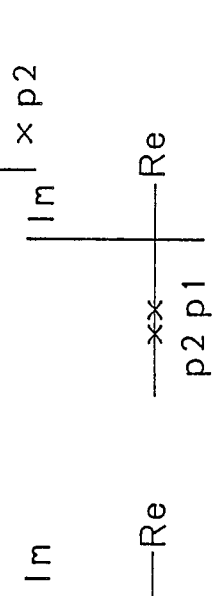
FIG. 9
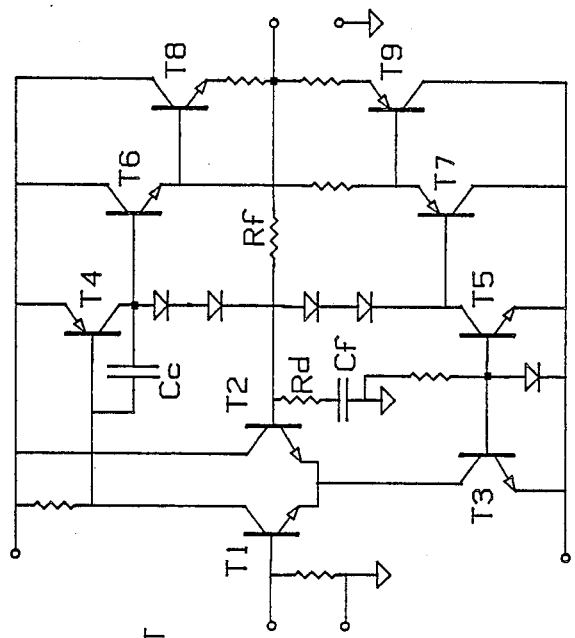
FIG. 2
PRIOR ART
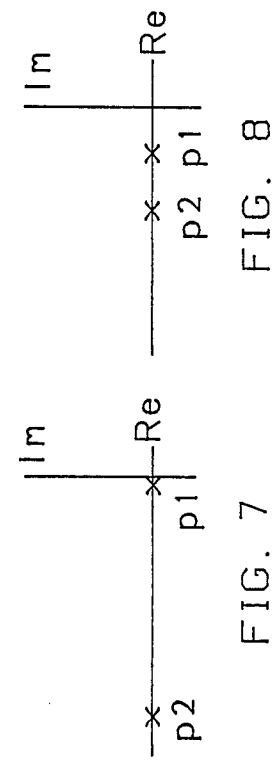
FIG. 8
FIG. 7

NONSLEWING AMPLIFIER

CROSS-REFERENCES

This application is a continuation-in-part of my prior copending application originally entitled "Two-Way High-Fidelity Amplifier", filed Feb. 29, 1988, Ser. No. 162,112 now U.S. Pat. No. 4,823,094 issued Apr. 18, 1989. The disclosure of said prior application is hereby incorporated herein by reference.

FIELD OF THE INVENTION

This invention relates to audio power amplifiers for high-fidelity music reproduction and other applications, and more particularly, to a novel amplifier topology permitting large amounts of feedback without audible distortion.

THE PRIOR ART

In the past decade of high-fidelity amplifier design the use of large amounts of overall negative feedback has fallen into disrepute. It is now generally believed that high-feedback designs provide poor sound reproduction due to so-called "transient intermodulation distortion". As a result high-fidelity amplifiers today embody little or no feedback and are thereby less accurate and more expensive than they would be if the theoretical benefits of large amounts of feedback could be obtained without generating such distortion. The problem may be best understood by considering the history of the art.

Prior to the invention of the direct-coupled amplifier topology of applicant's U.S. Pat. No. Re. 29,273 the amount of feedback was severely limited by the phase shifts caused by the reactances of coupling capacitors and transformers. The direct coupling of this patented topology eliminated such phase shifts and seemingly permitted the use of much larger amounts of feedback than previously feasible. Since static distortion measurements such as harmonic distortion and intermodulation distortion are reduced in direct proportion to the amount of feedback designed into the circuit, the large levels of feedback permitted by this direct-coupled topology enabled static distortion measurements to be reduced to almost unmeasurably small levels.

This direct-coupled circuit was universally adopted and brought about a competitive battle of advertised distortion specifications. Manufacturers kept increasing the feedback in their amplifier designs so as to be able to advertise lower distortion figures than their competitors. However nothwithstanding the vanishingly small static distortion figures achieved by these high-feedback designs, it eventually became apparent to perceptive listeners that there was little or no corelation between an amplifer's audible sound quality and its static distortion specifications. Some critics engaged in evaluating amplifiers even concluded that those amplifiers with the most feedback and lowest static distortion figures sounded the worst.

These evaluators misunderstood the mechanism by which the large feedback produced the poor sound quality and mistakenly blamed the poor sound quality on the time delay effects of the feedback network. Thinking that they had discovered a new phenomenon, they coined a new term, "transient intermodulation distortion". However designers of operational amplifiers had previously understood the mechanism which they had termed "slewing " or "slew limiting".

It is now generally understood that this distortion producing mechanism operates as follows. In order to provide feedback stability, the direct-coupled circuit, like other topologies, requires the usual compensation capacitor in the second stage. Transient intermodulation distortion or slewing is due to the inability of the first amplifier stage to provide enough signal current to charge and discharge this capacitor at the high rate required by high-frequency high-amplitude signals.

That is, the maximum time rate of change of the voltage at the input of the second stage is proportional to the maximum current available to charge or discharge the capacitor. If the frequency and amplitude of the signal are high enough the rate of change required by an undistorted replica of the signal exceeds the available maximum rate of change determined by the maximum available charging current, and the signal voltage at the input of the second stage becomes distorted. The second stage compensation capacitor then integrates the signal current output of the first stage so as to distort a sinusoidal signal into the shape of a ramp function, and the signal may be cut off during a part of the cycle.

This compensation capacitor is required in feedback amplifiers to increase the stability margin. It thereby increases the amount of feedback which may be utilized by the amplifier designer, and hence improves the static distortion specifications of the amplifier.

The more feedback designed into the amplifier, the lower the specification figures for static distortion. However, the greater the amount of feedback employed the larger becomes the compensation capacitor required to maintain feedback stability, as will be explained below. The larger the compensation capacitor the more susceptible the amplifier becomes to slewing. As a result, prior amplifier designs utilizing the most feedback generally had the least static (harmonic and intermodulation) distortion but frequently produced the worst sound when reproducing music due to the increased dynamic (slewing) distortion.

Even when the frequency and/or amplitude of the input signal was not quite sufficient to cause slewing the reactive input impedance of the second stage usually presented an excessive load to the first stage so as to result in the generation of audible distortion by said prior art circuit. The first stage of the latter was a differential emitter-coupled long-tailed pair which could provide an undistorted output signal for only a small current swing. The reactive input impedance of the second stage drew a larger signal current from the first differential stage than the latter could output without distortion.

SUMMARY OF THE INVENTION

It is therefore a primary object of the present invention to provide a novel amplifier circuit which permits the use of substantial compensation capacitors and therefore large amounts of stable feedback while nevertheless avoiding slew limiting and transient distortion when subjected to large high-frequency signals.

This is achieved by a novel cascade of first and second complementary stages which operate in a symmetrical push-pull grounded-emitter mode so that when one half of the first stage is slewing the other half of the stage nevertheless provides a large drive current to the second stage to drive the latter without substantial distortion.

DESCRIPTION OF THE DRAWINGS

FIG. 2 is a schematic circuit diagram of a simplified version of said direct-coupled amplifier circuit in accordance with the prior art as disclosed in applicant's U.S. Pat. No. Re. 29,273;

FIGS. 4 to 6 are s-plane plots showing the root locus of the dominant and second poles as the loop gain is increased in an amplifier without a compensation capacitor; and FIGS. 7 to 9 are s-plane plots showing the root locus of the dominant and second poles as the loop gain is increased in an amplifier having a compensation capacitor to "split" the initial positions of the poles.

DETAILED DESCRIPTION OF THE PRIOR ART

Figure 1:
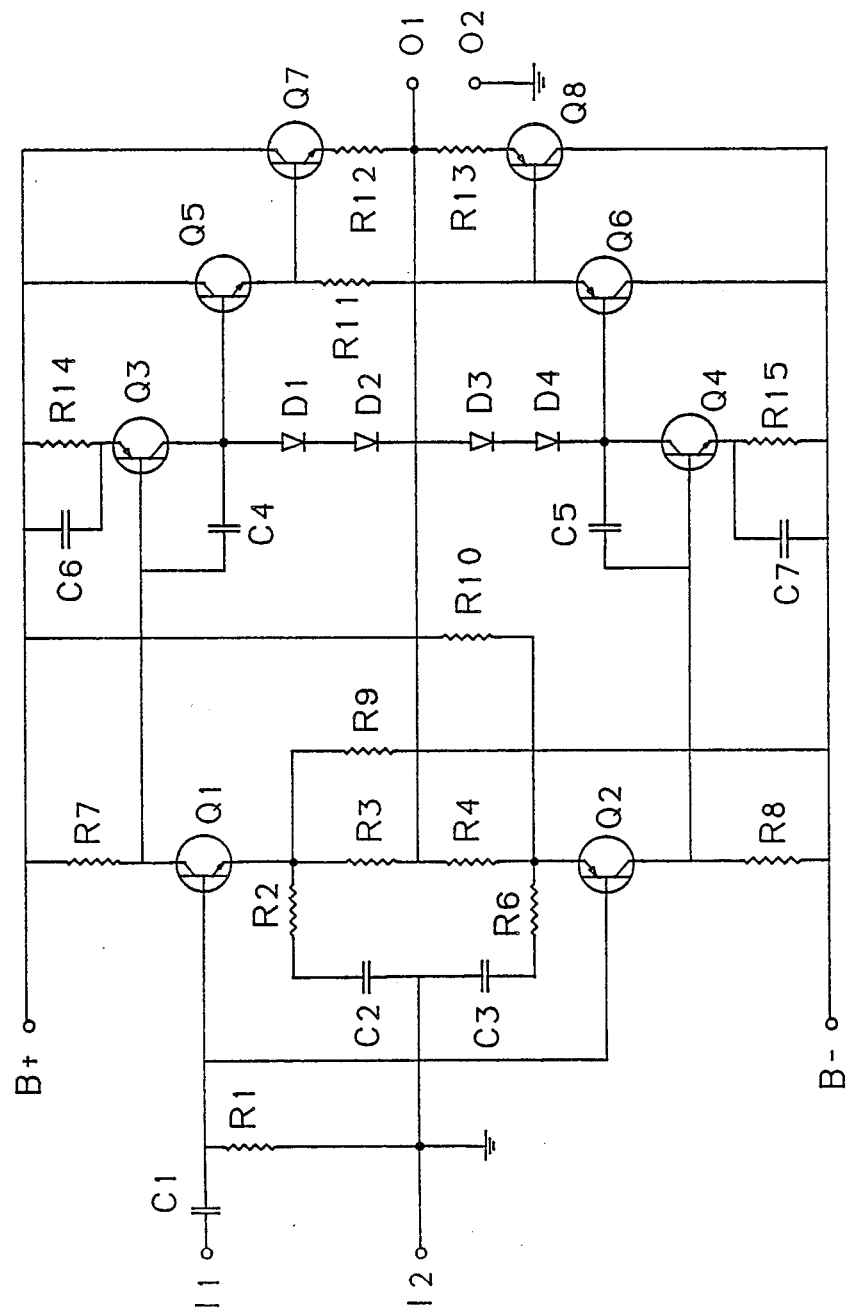
FIG. 1 is a schematic diagram of the simpler of the two disclosed circuits embodying the invention.
Figure 3:
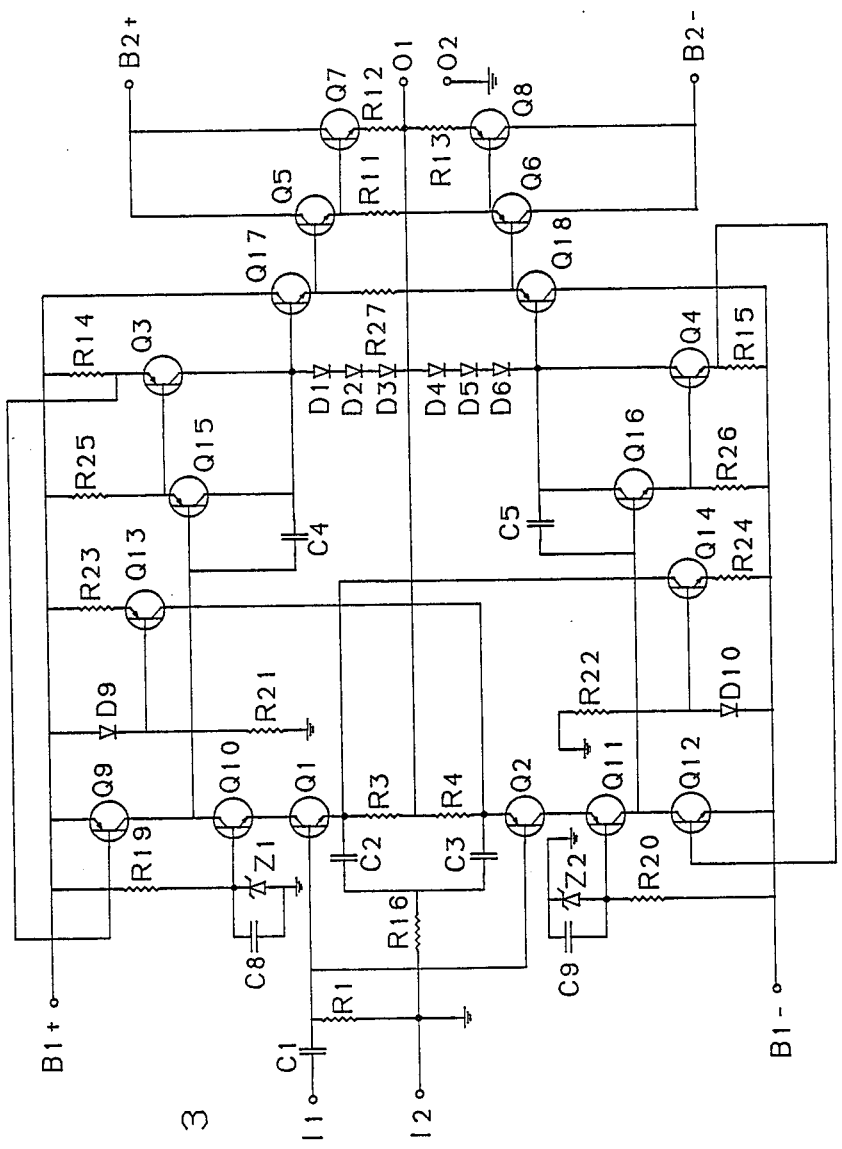
FIG. 3 is a schematic circuit diagram of a modified form of the invention.

The purpose, operation and advantages of the present invention shown in FIGS. 1 and 3 may be best understood by first considering the problems of the prior art circuit shown in FIG. 2. The latter is a typical version of the direct-coupled amplifier topology disclosed in U.S. Pat. No. Re. 29,273 and comprises a first differential stage including transistors T1,T2,T3, a second voltage-amplification stage including transistors T4,T5, a drive stage including transistors T6,T7, and an output stage including transistors T8,T9.

Transistors T1,T2 form an emitter-coupled differential pair. The hot input terminal of the amplifier is connected to the base of transistor T1. Transistor T3 is a current source connected to the emitter of T1,T2. The collector of T1 is directcoupled to the base of the second stage transistor T4 which operates in the grounded-emitter mode. The collector load of T4 is provided by T5 acting as a current source.

Transistors T6,T7 constitute a complementary push-pull emitter-follower drive stage and have their bases direct-coupled to the respective collectors of T4,T5. Output transistors T8,T9 also operate in a complementary push-pull emitter-follower mode and constitute the output stage. The bases of T8,T9 are direct-coupled to the respective emitters of T6,T7 and the emitters of T8,T9 are connected to the hot output terminal of the amplifier.

The feedback network comprises a resistor Rf extending from the amplifier output to the base of transistor T2, and a resistor Rd and capacitor Cf extending in series between said base and ground. Compensation capacitor Cc extends from the collector of transistor T4 to its base and serves to "split" or separate the poles of the amplifier transfer function. The significance and advantages of this will be explained after the following definitions.

The transfer function of an amplifier is the ratio of the LaPlace transform of the output signal to the LaPlace transform of the input signal, with the initial conditions set to zero. Since a high-fidelity amplifier requires a high input impedance and a low output impedance, the feedback topology is the seriesshunt type, and the transfer function is the ratio of the transform of the output voltage to the transform of the input voltage. The transfer function is a rational function with its numerator and denominator each in the form of a polynomial in the LaPlace transform variable s. The zeros of the numerator are the zeros of the transfer function and the zeros of the denominator are the poles of the transfer function.

An s-plane plot shows the magnitudes of the imaginary component and real component of a complex variable such as the poles and zeros of the transfer function. The value of the imaginary component is scaled in the vertical direction and that of the real component in the horizontal direction. That is, the ordinate is the imaginary axis Im in FIGS. 4 to 9, and the abscissa is the real axis Re.

The locations in the complex s-plane of the transfer function poles determine the response of the amplifier. If the poles are to the right of the imaginary axis Im of the s-plane, as shown at p1,p2 in FIG. 6, the amplifier has become an oscillator. That is, it will output a steady sinusoidal signal without any input. If the poles are complex and are in the left-half plane, as shown in FIG. 5, the amplifier output in response to either an impulse or step function is a damped sinusoid or oscillation and is therefore unsatisfactory for high-fidelity music reproduction. If the poles are on the negative real axis Re, as shown in FIG. 4, the amplifier output is non-oscillatory.

The dominant pole of an amplifier is that high-frequency pole which is at the lowest frequency; that is, closest to the imaginary axis Im. For example, in FIG. 4 the dominant pole is designated p1. The next lowest pole will be referred to as the second pole. It will be understood that a typical amplifier has many poles, although in FIGS. 4 to 9 only the dominant and second poles are shown because these two poles dominate the amplifier operation in that the amplifier response is largely determined by these two poles. The other poles are generally at much higher frequencies and exert much less influence on the amplifier response.

The open-loop gain is the forward gain of the basic amplifier with the feedback network disabled. The feedback factor is the fraction of the output signal which is fed back to the input stage by the feedback network. In the prior art circuit of FIG. 2 the feedback network Rf,Rd,Cf forms a voltage divider and the feedback factor may be calculated as the ratio of resistor Rd to the sum of resistor Rd plus resistor Rf. The loop gain is the product of the feedback factor and the open-loop gain of the amplifier.

The effect of the compensation capacitor Cc on the poles will now be described. Discussing first an amplifier without the compensation capacitor Cc and without the application of any feedback, that is, with the feedback factor and therefore the loop gain equal to zero, the dominant and second poles are relatively close to each other as depicted at p1,p2 in FIG. 4. If feedback is now applied it will cause movement of each pole in a path called a "root locus". More specifically, it can be shown by root locus theory that as increasing amounts of feedback are applied to an amplifier design having initial dominant and second poles as shown in FIG. 4 the dominant pole p1 will move along the negative real axis to the left and the second pole p2 will move along the same axis to the right, so that the poles p1,p2 approach each other.

Further increase in the amount of feedback designed into the amplifier will eventually cause the poles to meet on the negative real axis and then break away from the axis with one pole going above and the other pole below the axis, as shown in FIG. 5. In the latter figure the poles have become complex. That is, they each have an imaginary component of opposite sign so as to be complex conjugates. Further increases in the amount of feedback in the amplifier design will eventually cause the poles to move into the right-half plane as at p1,p2 in FIG. 6.

Since a high-fidelity amplifier having the pole configuration of FIG. 5 is unsatisfactory in that its response to a transient signal includes a damped oscillation, and one having the pole configuration of FIG. 6 is a steady-state oscillator rather than an amplifier, it is necessary that the maximum feedback be limited to that amount at which the dominant and second poles have come together at the so-called "breakaway" point but have not yet departed from the negative real axis. The farther apart the initial open-loop positions of these poles on the negative real axis (before the application of feedback) the greater is the amount of feedback which may be designed into the amplifier before this feedback maximum is reached.

For example, an amplifier having the initial open-loop pole pattern of FIG. 4 would reach this breakaway limit with the application of a small amount of feedback because the open-loop poles are initially close to each other, whereas an amplifier having the initial open-loop pole pattern of FIG. 7 with widely spaced poles would be capable of incorporating a much larger amount of feedback in its design before the poles reach this breakaway limit.

The undesirable closely spaced pole pattern of FIG. 4 is converted to the desirable widely spaced pole pattern of FIG. 7 by the addition of a compensation capacitor as shown at Cc in the prior art circuit of FIG. 2. Capacitor Cc extending from the collector to the base of transistor T4 provides a so-called "pole splitting" effect. That is, before the application of feedback in the design, the initial open-loop position of the dominant pole p1 is relocated by this pole-splitting effect to the right along the negative real axis Re of the s-plane at a much lower frequency, and the initial open-loop position of the second pole p2 is relocated to the left at a much higher frequency on this axis.

This wider spacing of the open-loop positions of the poles greatly improves the stability of the amplifier in that a much larger amount of feedback may be utilized in its design before the poles relocate to the breakaway point and the response becomes oscillatory. The increased feedback is advantageous in that the static distortion measurements, such as harmonic distortion and static intermodulation distortion, are reduced proportionately to the amount of feedback employed. However, in the prior art amplifier of FIG. 2 the price to be paid for any substantial improvement in this respect is usually not worth the improvement because the slewing ("transient intermodulation distortion") resulting from a substantial compensation capacitor Cc usually degrades the amplifier sound more than the original static distortions.

The mechanism by which the compensation capacitor Cc produces this slewing effect is as follows. A differential amplifier stage such as T1,T2 in FIG. 2 has a limited output current capability. When the input signal at the base of T1 is positive so as to turn on T1 in the direction of greater collector current and thereby discharge compensation capacitor Cc, the maximum current that the collector can draw is the total quiescent current of both transistors T1,T2 of the stage as determined and limited by current source transistor T3. A typical value for this quiescent current is about one milliampere. When the input signal at the base of T1 is negative so as to drive T1 in the direction of cutoff, compensation capacitor Cc can be charged solely by the current flowing downwardly from the positive power supply terminal and through the collector load impedance of T1. This current is also limited, usually to a value of one-half the total quiescent current.

Therefore, for both polarities of the input signal, the maximum output current of the input stage T1,T2 is limited to a small predetermined magnitude. If the latter is less than the total required to charge or discharge compensation capacitor Cc and also to drive the base of transistor T2 at the rate required by the signal, then the amplifier undergoes slewing. This condition arises during high-frequency high-amplitude signals because the required current for charging or discharging compensation capacitor Cc is proportional to the time rate of change of the signal voltage. During slewing the compensation capacitor Cc causes the second stage to act as an integrator so as to distort the signal at the collector of T1 and base of T4, and the signal may be cut off for a part of the signal cycle so that the transient intermodulation distortion is 100 percent.

Furthermore, even if the frequency and/or amplitude of the signal is not sufficient to cause slewing, the reactive loading effect on the first stage by the compensation capacitor Cc is likely to cause audible distortion of many signals which are only moderately high in frequency and amplitude.

DESCRIPTION OF FIG. 1

Referring now to FIG. 1, the latter discloses an amplifier circuit embodying the present invention. This circuit comprises an input stage including transistors Q1,Q2, a second voltage amplification stage including transistors Q3,Q4, a drive stage including transistors Q5,Q6 and an output stage including transistors Q7,Q8.

The input stage is complementary with transistor Q1 shown as type NPN and transistor Q2 as type PNP. These transistors operate in the grounded-emitter push-pull Class A mode.

The term "grounded-emitter" is employed herein instead of "common-emitter" because the latter term is frequently used to include a differential stage such as at T1,T2 in FIG. 2. The term "grounded-emitter" as used in this application includes a topology having the emitter or source electrode AC coupled to ground through a small resistor as at R2,R6 in FIG. 1.

The bases of both transistors Q1,Q2 are connected to the hot input terminal I1 through input coupling capacitor C1 and to ground through resistor R1. The other input terminal I2 is also connected to ground. The collector of transistors Q1 is connected to the positive supply terminal B+ through load resistor R7 and the collector of transistor Q2 is similarly connected to the negative supply terminal B− through load resistor R8. The emitter of transistor Q1 is provided with bias current by a current source in the form of a resistor R9 extending to the negative supply terminal B−, and the emitter of transistor Q2 is similarly provided with bias current by a current source in the form of a resistor R10 extending to the positive supply terminal B+.

The feedback network comprises resistors R3,R4 extending from the hot output terminal O1 to the respective emitters of transistors Q1,Q2, and resistors R2,R6 connected in series between the respective emitters and ground through the respective capacitors C2,C3.

The collector of input transistor Q1 is direct-coupled to the base of second stage transistor Q3 and the collector of input transistor Q2 is similarly direct-coupled to the base of second stage transistor Q4. Transistors Q3,Q4 are complementary with transistor Q3 shown as type PNP and transistor Q4 as type NPN. These transistors operate in a push-pull grounded-emitter Class A mode. The emitter of transistor Q3 is connected to the positive supply terminal B+ by a resistor R14 in parallel with a bypass capacitor C6, and the emitter of transistor Q4 is connected to the negative supply terminal B− by a resistor R15 in parallel with a bypass capacitor C7. thereby connected to AC ground. A series chain of four bias diodes D1,D2,D3,D4 extends between the collectors of transistors Q3,Q4.

A first compensation capacitor C4 is connected at one end to the collector of transistor Q3 and at its other end to the base of transistor Q3 and collector of transistor Q1. A second compensation capacitor C5 is connected at one end to the collector of transistor Q4 and at its other end to the base of transistor Q4 and collector of transistor Q2.

The collectors of transistors Q3,Q4 are direct-coupled to the respective bases of drive transistors Q5,Q6. The latter are complementary with transistor Q5 shown as type NPN and transistor Q6 as type PNP, Drive transistors Q5,Q6 operate push-pull in the emitter-follower mode, preferable in Class A. The collector of transistor Q5 is connected to the positive supply terminal B+ and the collector of transistor Q6 is connected to the negative supply terminal B−. A bias resistor R11 extends between the emitters of transistors Q5,Q6.

The emitters of drive transistors Q5,Q6 are direct-coupled to the respective bases of output transistors Q7,Q8. The latter are complementary with transistor Q7 shown as type NPN and transistor Q8 as type PNP. Output transistors Q7,Q8 operate push-pull in the emitter-follower mode, and are preferably biased for Class AB operation. The emitter of output transistor Q7 is connected to the hot output terminal O1 by an emitter resistor R12 and the emitter of output transistor Q8 is similarly connected to the hot output terminal O1 by an emitter resistor R13. The other output terminal 02 is grounded.

OPERATION OF THE INVENTION

For signals at low and middle frequencies the operation of the invention disclosed in FIG. 1 is easily understood. A positive input signal applied to input terminal I1 drives input transistor Q1 toward a higher collector current operating point and drives input transistor Q2 toward a lower collector current operating point. This causes the voltage at the collector of transistor Q1 and base of transistor Q3 to lower toward ground level and also causes the voltage at the collector of transistor Q2 and base of transistor Q4 to become more negative and to lower toward the level of negative supply terminal B−. Transistor Q3 is thereby driven to a higher collector current operating point and transistor Q4 is driven to a lower collector current operating point. The respective voltages at the collectors of both transistors Q3,Q4 thereby tend to rise in the positive direction.

The bases of drive transistors Q5,Q6 are thereby driven in the positive direction. Since these transistors operate in the emitter-follower mode the voltages at their emitters also increase in the positive direction so as to drive the bases of output transistors Q7,Q8 in the positive direction. The latter also operate as emitter-followers and the voltages at their emitters also increase in the positive direction, thereby driving output terminal O1, and any speaker or other load connected to the latter, positively. It will be obvious that a negative input signal applied to input terminal I1 will drive each stage with a polarity opposite to that described above for a positive input signal.

For high-frequency input signals, particularly those of high-amplitude, the novel mode of operation of the present invention is more complex and will now be described. Assume that a large fast positive signal is applied to input terminal I1 and hence to the bases of input transistors Q1,Q2. The operating point of transistor Q2 will be driven toward cutoff and its collector voltage will move down toward supply terminal B1−.

For the voltage at the collector of Q2 to change compensation capacitor C5 must be charged by current flow downward through collector load resistor R8. The magnitude of this current is limited to a small value, as explained above with respect to the collector load resistor of transistor T1 in the prior art circuit of FIG. 2. Therefore if the amplitude and frequency of the input signal are high enough, slewing will occur at the collector of transistor Q2. That is, all of the current sunk by resistor R8 will be consumed in charging capacitor C5 which, in conjunction with transistor Q4, will act as an integrator of the signal at the collector of transistor Q2. As a result the signal voltage at the base of transistor Q4 will be distorted into the shape of a ramp function as capacitor C5 is being charged at the slewing rate.

However, unlike the prior art circuit of FIG. 2, this slewing condition in FIG. 1 will not result in a significantly distorted signal at the output of the amplifier of the present invention, because of the following mode of operation. Although as described above the two lower transistors Q2 and Q4 have entered a slewing state, the upper transistor Q3 will nevertheless be driven by the other upper transistor Q1 without substantial distortion. Unlike the differential pair T1,T2 of the prior art circuit of FIG. 2, input transistor Q1 of FIG. 1 has its emitter connected to ground through a relatively low impedance comprising emitter resistor R2 and capacitor C2. As a result the maximum collector current of transistor Q1 is quite large and is limited only by the device characteristics, instead of by a current source as at T3 in the prior art circuit of FIG. 2.

This large collector current of transistor Q1 is capable of discharging the upper compensation capacitor C4 at a rate fast enough to avoid slewing for any reasonable input signal likely to be applied to a high-fidelity amplifier. That is, the voltage at the base of transistor Q3 will be a substantially undistorted replica of the original input signal. This undistorted signal will be amplified by transistor Q3 while transistor Q4 functions as a current source. The resulting undistorted amplified signal appearing at the collectors of transistors Q3,Q4 and will then be transmitted through the following drive and output stages of the amplifier.

It will be seen that the slewing condition of the lower transistors Q2 and Q4 will not prevent the upper transistors Q1 and Q3 from operating without substantial distortion. Even assuming that the voltage at the base of transistor Q4 is being slowly integrated by a very large compensation capacitor so as to have a very slow rate of change and he almost constant, this transistor will then operate as a current source so that its collector will have a very high output impedance and follow the undistorted signal voltage swing of the collector of the upper transistor Q3.

Since the circuit of FIG. 1 is symmetrical and operates push-pull, the same mode of operation results when the input is a fast negative signal. In this event the upper transistors Q1 and Q3 may undergo slewing while the lower transistors Q2 and Q4 will nevertheless be able to amplify and transmit a substantially undistorted signal to the drive stage Q5,Q6 and output stage Q7,Q8. Collector load resistor R7 may be unable to supply enough current to charge compensation capacitor C4 at a rate fast enough to maintain an undistorted signal at the base of transistor Q3 so that the voltage at the base will be determined by the integrating effect of compensation capacitor C4. Nevertheless, the lower input transistor Q2 will be driven in the direction of greater collector current which will almost invariably be sufficient to discharge compensation capacitor C5 at a rate commensurate with the rate of change of the signal at the collector of Q2 and base of Q4, assuming that the input signal is of an amplitude and speed which is reasonable for input to a high-fidelity amplifier. Thus slewing distortion and lesser degrees of transient distortion are substantially avoided in the drive and output stages notwithstanding the slewing condition of upper transistors Q1 and Q3.

Although the primary advantage of the present invention is the substantial elimination of slewing distortion and lesser forms of transient distortion caused by the reactive loading of the first stage by a compensation capacitor in the second stage during the amplification of high-frequency high-amplitude signals, the present circuit also provides other secondary advantages at low and middle frequencies.

More specifically, distortion at all frequencies is reduced by the balanced symmetrical push-pull topology which results in substantial distortion cancellation. The balanced symmetry also serves to minimize the DC offset at the output terminal O1, and to reduce the effect of any ripple or signal voltage at the power supply terminals B+,B−.

Further, the DC bias of the amplifier is stabilized by the substantially constant emitter current provided by emitter resistors R9,R10. Also important is the fact that the emitters of the input stage Q1,Q2 are substantially grounded for AC signals so that this stage can output large signal swings with much greater linearity than the conventional emitter-coupled differential stage such as at T1,T2 of the prior art circuit of FIG. 2.

Still other advantages will be obvious to those skilled in the art or ar inherent in the disclosed circuitry.

Although the amount of overall negative feedback which can be implemented in the circuit design of FIG. 1 is not limited by considerations of stability margin or slewing distortion, it is definitely limited by the available voltage gain and sensitivity requirements of a practical amplifier. The latter should be driven to full power output by an input signal of at most about two or three volts, and this requirement limits the amount of feedback which may be designed into the circuit of FIG. 1. In order to achieve more voltage gain and and more feedback, and also a greater stability margin, the circuit may be modified in the manner shown in FIG. 3 which will now be described.

DESCRIPTION OF FIG. 3

Referring now to FIG. 3, there is shown another embodiment of the invention which operates in a manner similar to that described above with respect to the embodiment of FIG. 1. Those components having the same reference letters and numerals in the two figures are identical or equivalent. The circuit of FIG. 3 has more voltage gain because the first stage operates in the cascode mode, and the collector load impedances are active transistor current sources with a larger impedance than the mere passive resistors of FIG. 1. The cascode mode also improves the frequency response of the first stage and thereby improves the feedback stability margin. Also, two additional emitter-follower stages have been inserted in cascade in the embodiment of FIG. 3 to reduce the driving current required from the first two stages.

More specifically, collector load resistor R7 of FIG. 1 is replaced in FIG. 3 by an active current source comprising a PNP transistor Q9 having its emitter connected to positive supply terminal B1+, its collector connected in series with the collector of transistor Q10, and its base biased by feedback from the emitter resistor R14 of transistor Q3. Collector load resistor R8 of FIG. 1 is similarly replaced in FIG. 3 by an active current source comprising an NPN transistor Q12 having its emitter connected to negative supply terminal B1−, its collector connected in series with the collector of transistor Q11, and its base biased by feedback from the emitter resistor R15 of transistor Q4. These feedback biasing networks tend to stabilize the quiescent current in transistors Q3,Q4.

Emitter bias resistor R9 of FIG. 1 is replaced in FIG. 3 by an active current source comprising an NPN transistor Q14 having its collector connected to the emitter of transistor Q1, its emitter connected by a resistor R24 to negative supply terminal B1−, and its base biased by a diode D10 and a resistor R22. Emitter bias resistor R10 of FIG. 1 is similarly replaced in FIG. 3 by an active current source comprising a PNP transistor Q13 having its collector connected to the emitter of transistor Q2, its emitter connected through a resistor R23 to positive supply terminal B1+, and its base biased by a diode D9 and a resistor R21.

Transistors Q10 and Q1 form a cascode circuit with the emitter of Q10 driven by the collector of Q1. Transistor Q10 is connected in the common-base mode with its base biased at a fixed voltage by resistor R19, zener diode Z1 and capacitor C8. Transistors Q2 and Q11 are similarly coonnected in cascode with the emitter of Q11 driven by the collector of Q2 and the common base of Q11 biased by resistor R20, zener diode Z2 and capacitor C9.

Interposed in cascade in FIG. 3 between the collector output of transistor Q10 and the base input of transistor Q3 is a PNP transistor Q15 having its emitter direct-coupled to the base of Q3 and its collector connected to the collector of Q3 so that transistors Q15,Q3 form a Darlington pair. The base of transistor Q15 is direct-coupled to the collectors of transistors Q10,Q9. A resistor R25 extends between supply terminal B1+ and the emitter of transistor Q15. Similarly interposed in cascade between the collector output of transistor Q11 and the base input of transistor Q4 is an NPN transistor Q16 having its emitter direct-coupled to the base of transistor Q4 and its collector connected to the collector of Q4 so that transistors Q16,Q4 form another Darlington pair. The base of transistor Q16 is direct-coupled to the collectors of transistors Q11,Q12. A resistor R26 extends between supply terminal B1− and the emitter of transistor Q16.

Still referring to FIG. 3, an additional complementary push-pull emitter-follower drive stage Q17,Q18 is inserted in cascade between voltage-amplification stage Q3,Q4 and the original drive stage Q5,Q6. The bases of transistors Q17,Q18 are direct-coupled to the respective collectors of transistors Q3,Q4 and their emitters are direct-coupled to the respective bases of drive transistors Q5,Q6. A bias resistor R27 extends between the emitters of drive transistors Q17,Q18 and another bias resistor R11 extends between the emitters of drive transistors Q5,Q6. Output transistors Q7,Q8 are each provided with an emitter resistor R12 or R13.

The collectors of drive transistors Q17,Q18 are connected to respective supply terminals B1+,B1−. A second power supply is provided with terminals B2+,B2− connected to the collectors of drive transistors Q5,Q6 and also the collectors of output transistors Q7,Q8. Since the embodiment of FIG. 3 has three emitter-follower stages in cascade providing six base-emitter junctions, there are six bias diodes D1 to D6 in series instead of the four diodes shown in FIG. 1.

One compensation capacitor C4 is connected at one end to the collectors of transistors Q15,Q3 and at Its other end to the base of Q15 and collector of Q10. The other compensation capacitor C5 is similarly connected between the collectors of transistors Q16 Q4 and the base of Q16 and collector Q11. It is well-known that a compensation capacitor extending from the collector output to the base input of a Darlington pair, as in FIG. 3, has the same pole-splitting effect as a capacitor extending from the collector to base of a single transistor, as in FIG. 1.

The second stage of the circuit of FIG. 3, now shown as comprising the Darlington pairs Q3,Q15 and Q4,Q16, may be modified to embody a cascode topology in a manner similar to that shown and described above with respect to the first stage. More specifically, a common-base PNP transistor (not shown) may be inserted in series between transistor Q3 and diode D1, and a common-base NPN transistor (not shown) may be inserted in series between diode D6 and transistor Q4. The emitters of these inserted transistors would be connected to the respective collectors of transistors Q3,Q4 and their collectors would be connected to the respective diodes D1,D6. The bases of these inserted transistors may each be biased at a fixed voltage by biasing networks similar to those shown at R19,Z1,C8 and R20,Z2,C9. Compensation capacitor C4 would then be connected to the collector of the inserted PNP transistor (not shown) instead of transistor Q3, and compensation capacitor C5 would then be connected to the collector of the Inserted NPN transistor (not shown) instead of transistor Q4. The bases of transistors Q17,Q18 would be direct-coupled to the respective collectors of the inserted transistors.

Other modifications will be obvious to those skilled in the art without departing from the scope of the invention as delineated by the appended claims which are to be interpreted as broadly as permitted by the prior art.

I claim:

1. A nonslewing amplifier comprising
  first amplification means including at least one complementary-symmetry push-Pull amplification stage and having two output nodes,
  second amplification means including at least one complementary-symmetry push-pull amplification stage and having two input nodes each connected to a respective one of said first amplification means output nodes and also having two output nodes,
  a push-pull output stage,
  circuit means drivingly connecting said output stage to said second amplification means output nodes, and
  a pair of capacitive compensation means each connected between a respective one of said second amplification means output nodes and a respective one of said second amplification means input nodes.

2. An amplifier as recited in claim 1 wherein
  said capacitive compensation means provide the dominant high-frequency pole of the amplifier transfer function.

3. An amplifier as recited in claim 1 wherein said first amplifier means amplification stage comprises
  a pair of complementary transistors each having an output electrode connected to a respective one of said first-recited output nodes,
  a power supply having a positive supply terminal and a negative supply terminal,
  a pair of load impedance means each connected between a respective one of said supply terminals and a respective one of said output electrodes,
  each of said transistors conducting current to change the charge on the respective capacitive compensation means when the transistor is driven in the direction of increasing current and each of said load impedance means conducting current to change the charge on the respective capacitive compensation means when the transistor is driven in the direction of decreasing current,
  each of said transistors having a maximum current capability at least one order of magnitude larger than that of its respective load impedance means,
  whereby when one transistor is driven in the direction of decreasing current and at a rate of change exceeding the slewing limit the other transistor is driven in the direction of increasing current to drive the second amplification means without slewing distortion.

4. An amplifier as recited in claim 1 wherein
  said first amplification means amplification stage comprises a pair of complementary transistors normally biased for Class A operation and each transistor being capable of being driven either in the high-current direction toward saturation or the low-current direction toward cut-off,
  means driving said transistors in push-pull so that when one transistor is driven in the high-current direction the other transistor is driven in the low-current direction,
  one half of the first amplification stage being prone to slewing while its transistor is driven in the low-current direction while the transistor of the other half of said first amplification stage is driven in the high-current direction without slewing so as to drive the second amplification means without distortion.

5. An amplifier as recited in claim 1 wherein said second amplification means amplification stage comprises
  a pair of complementary-polarity transistors each having a collector, a base and an emitter,
  a power supply having a positive terminal and a negative terminal,
  first means connecting each of said emitters to a respective one of said power supply terminals,
  second means connecting each of said bases to a respective one of said second amplification means input nodes, and third means connecting each of said collectors to a respective one of said second amplification means output nodes.

6. An amplifier as recited in claim 1 and comprising an input terminal,
a ground,
a power supply having a positive terminal and a negative terminal,
said first amplification means amplification stage including
a pair of complementary polarity transistor each having a collector, a base and an emitter,
a pair of load impedance means each connecting a respective one of said collectors to a respective one of said power supply terminals,
means connecting each of said bases to said input terminal,
means AC coupling each of said emitters to said ground, and
a pair of current source means each extending from a respective one of said supply terminals to a respective one of said emitters to supply bias current to the latter.

7. An amplifier as recited in claim 1 and comprising an input terminal,
a ground,
a power supply having a positive terminal and a negative terminal,
said first amplification means amplification stage including
a pair of complementary-polarity transistors each having a collector, a base and an emitter,
a pair of load impedance means each connecting a respective one of said collectors to a respective one of said power supply terminals,
means connecting each of said bases to said input terminal, and
means coupling each of said emitters to said ground.

8. An amplifier as recited in claim 7 wherein said second amplification means voltage-amplification stage comprises
a second pair of complementary-polarity transistors each having a collector, a base and an emitter,
first means connecting each of said last-recited emitters to a respective one of said power supply terminals,
second means connecting each of said last-recited bases to a respective one of said second amplification means input nodes, and
third means connecting each of said last-recited collectors to a respective one of said second amplification means output nodes,
each of said capacitive compensation means including a capacitor having one end conductively connected to a respective one of said second amplification means transistor collectors and its other end conductively connected to a respective one of said first amplification means transistor collectors.

9. A nonslewing amplifier comprising
a first complementary-symmetry push-pull grounded-emitter stage including a pair of complementary transistors each having a collector, a base and an emitter,
an input terminal,
means coupling said bases to said input terminal,
a ground,
means AC coupling each of said emitters to said ground,
a second complementary-symmetry push-pull grounded-emitter stage including a second pair of complementary transistors each having a collector, a base and an emitter,
means coupling each of said second stage transistor bases to a respective one of said first stage transistor collectors,
means AC coupling each of said second stage transistor emitters to said ground,
a pair of compensation capacitors,
means conductively connecting one end of each of said compensation capacitors to a respective one of said second stage transistor collectors, and
means conductively connecting the other end of each of said compensation capacitors to a respective one of said first stage transistor collectors.

10. An amplifier as recited in claim 9 and comprising
a pair of power supply terminals of opposite polarities,
a pair of load impedance means each connected between a respective one of said first stage transistor collectors and a respective one of said power supply terminals, and
a pair of current source means each extending from a respective one of said power supply terminals to a respective one of said first stage transistor emitters for providing bias current to the latter.

11. An amplifier as recited in claim 10 and comprising
a complementary symmetry push-pull emitter-follower drive stage including a pair of complementary transistors each having a collector, a base and an emitter,
means transmitting a signal from each of said second stage transistor collectors to a respective one of said drive stage transistor bases,
means connecting each of said drive stage transistor collectors to a respective one of said power supply terminals,
a complementary-symmetry push-pull emitter-follower output stage including a pair of complementary transistors each having a collector, a base and an emitter,
means coupling each of said drive stage transistor emitters to a respective one of said output stage transistor bases,
means connecting each of said output stage transistor collectors to a respective one of said power supply terminals,
an output terminal, and
means connecting said output stage transistor emitters to said output terminal.

12. A nonslewing amplifier comprising
first complementary-symmetry push-pull stage including a pair of complementary transistors each having an output electrode, an input electrode and a common electrode,
an input terminal,
means coupling said input electrodes to said input terminal,
a ground,
means AC coupling each of said common electrodes to said ground,
a second complementary-symmetry push-pull stage including a second pair of complementary transistors each having a output electrode, an input electrode and a common electrode, means coupling each of said second stage transistor input electrodes to a respective one of said first stage transistor output electrodes, means AC coupling each of said second stage transistor common electrodes to said ground, a pair of compensation capacitors, means conductively connecting one end of each of said compensation capacitors to a respective one of said second stage transistor output electrodes, and means conductively connecting the other end of each of said compensation capacitors to a respective one of said second stage transistor input electrodes.

13. An amplifier as recited in claim 12 and comprising a pair of power supply terminals of opposite polarities, a pair of load impedance means each connected between a respective one of said first stage transistor output electrodes and a respective one of said power supply terminals, and a pair of current source means each extending from a respective one of said power supply terminals to a respective one of said first stage transistor common electrodes.

14. An amplifier as recited in claim 13 and comprising a complementary-symmetry push-pull drive stage including a pair of complementary transistors each having a common electrode, an input electrode and an output electrode, means coupling each of said second stage transistor output electrodes to a respective one of said drive stage transistor input electrodes, means connecting each of said drive stage transistor common electrodes to a respective one of said power supply terminals, a complementary-symmetry push-pull output stage including a pair of complementary transistors each having a common electrode, an input electrode and an output electrode, means coupling each of said drive stage transistor output electrodes to a respective one of said output stage transistor input electrodes, means connecting each of said output stage transistor common electrodes to a respective one of said power supply terminals, an output terminal, and means connecting said output stage transistor output electrodes to said output terminal.

15. A nonslewing amplifier comprising first push-pull amplification means having two output nodes, second push-pull amplification means having two input nodes and two output nodes, a pair of circuit means each connecting a respective one of said first amplification means output nodes to a respective one of said second amplification means input nodes, a push-pull output stage, means drivingly coupling said output stage to said second amplification means output nodes and a pair of capacitive compensation means each connected between a respective one of said second amplification means output nodes and a respective one of said circuit connecting means.

16. An amplifier as recited in claim 15 wherein said capacitive compensation means provide a dominant pole of the amplifier transfer function.

17. An amplifier as recited in claim 15 wherein said first amplification means comprises a pair of complementary transistors each having an output electrode connected to a respective one of said first-recited output nodes, a power supply having a positive supply terminal and a negative supply terminal, and a pair of load impedance means each connected between a respective one of said supply terminals and a respective one of said output electrodes.

18. An amplifier as recited in claim 15 wherein said first amplification means comprises a pair of complementary transistors normally biased for Class A operation and each transistor being capable of being driven either in the high-current direction toward saturation or the low-current direction toward cut-off, and means driving said transistors in push-pull so that when one transistor is driven in the high-current direction the other transistor is driven in the low-current direction.

19. An amplifier as recited in claim 15 wherein each of said amplification means comprises a pair of complementary-polarity transistors, each of said first amplification means transistors having a collector, each of said second amplification means transistors having a base, and means drivingly connecting each of said first amplification means transistor collectors to a respective one of said second amplification means transistor bases.

20. An amplifier as recited in claim 15 and comprising an input terminal, a ground, a power supply having a positive terminal and a negative terminal, said first amplification means including a first pair of complementary transistors each having a collector, a base and an emitter, a second pair of complementary transistors each connected in cascode relation to a respective one of said first pair of transistors and each having a collector, a pair of load impedance means each connecting a respective one of said collectors of said second pair of transistors to a respective one of said power supply terminals, means connecting said bases of said first pair of transistors to said input terminal, and means AC coupling each of said emitters of said first pair of transistors to said ground.

* * * * *